United States Patent
Shalvi et al.

(10) Patent No.: US 8,151,166 B2
(45) Date of Patent: *Apr. 3, 2012

(54) REDUCTION OF BACK PATTERN DEPENDENCY EFFECTS IN MEMORY DEVICES

(75) Inventors: Ofir Shalvi, Ra'anana (IL); Zeev Cohen, Zichron-Yankov (IL)

(73) Assignee: Anobit Technologies Ltd., Herzliya (IL)

( * ) Notice: Subject to any disclaimer, the term of this patent is extended or adjusted under 35 U.S.C. 154(b) by 1058 days.

This patent is subject to a terminal disclaimer.

(21) Appl. No.: 12/037,487

(22) Filed: Feb. 26, 2008

(65) Prior Publication Data

US 2008/0219050 A1 Sep. 11, 2008

Related U.S. Application Data

(63) Continuation-in-part of application No. 11/995,801, filed as application No. PCT/IL2007/000576 on May 10, 2007.

(60) Provisional application No. 60/891,569, filed on Feb. 26, 2007, provisional application No. 60/938,192, filed on May 16, 2007, provisional application No. 60/886,429, filed on Jan. 24, 2007.

(51) Int. Cl.
*G11C 29/00* (2006.01)
*G06F 11/00* (2006.01)
(52) U.S. Cl. ............... 714/763; 714/708; 714/710
(58) Field of Classification Search ............... 714/763, 714/708, 710
See application file for complete search history.

(56) References Cited

U.S. PATENT DOCUMENTS

| 3,668,631 | A | 6/1972 | Griffith et al. |
| 3,668,632 | A | 6/1972 | Oldham |
| 4,058,851 | A | 11/1977 | Scheuneman |
| 4,112,502 | A | 9/1978 | Scheuneman |
| 4,394,763 | A | 7/1983 | Nagano et al. |
| 4,413,339 | A | 11/1983 | Riggle et al. |
| 4,556,961 | A | 12/1985 | Iwahashi et al. |
| 4,558,431 | A | 12/1985 | Satoh |

(Continued)

FOREIGN PATENT DOCUMENTS

EP 0783754 B1 7/1997

(Continued)

OTHER PUBLICATIONS

U.S. Appl. No. 11/949,135 Official Action dated Oct. 2, 2009.

(Continued)

*Primary Examiner* — Joseph D Torres
(74) *Attorney, Agent, or Firm* — D. Kligler IP Services Ltd.

(57) ABSTRACT

A method for operating a memory that includes multiple analog memory cells includes storing data in the memory by writing first storage values to the cells, so as to cause the cells to hold respective electrical charge levels. After storing the data, second storage values are read from at least some of the cells, including at least one interfered cell that belongs to a group of cells. A Back Pattern Dependency (BPD) distortion caused by the electrical charge levels of one or more interfering cells in the group to at least one of the second storage values read from the at least one interfered cell is detected and canceled. The second storage values, including the at least one of the second storage values in which the BPD distortion was canceled, are processed so as to reconstruct the data.

37 Claims, 3 Drawing Sheets

U.S. PATENT DOCUMENTS

| | | |
|---|---|---|
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A * | 2/1999 | Ishii et al. ............ 365/185.24 |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A * | 11/1999 | Ishii et al. ............ 365/185.24 |
| 5,991,517 A | 11/1999 | Harari et al. |
| 5,995,417 A | 11/1999 | Chen et al. |
| 6,009,014 A | 12/1999 | Hollmer et al. |
| 6,009,016 A * | 12/1999 | Ishii et al. ............ 365/185.24 |
| 6,023,425 A * | 2/2000 | Ishii et al. ............ 365/185.24 |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A * | 10/2000 | Tanaka et al. ............ 365/185.03 |
| 6,134,143 A | 10/2000 | Norman |
| 6,134,631 A | 10/2000 | Jennings |
| 6,141,261 A | 10/2000 | Patti |
| 6,151,246 A * | 11/2000 | So et al. ............ 365/185.09 |
| 6,157,573 A * | 12/2000 | Ishii et al. ............ 365/185.24 |
| 6,166,962 A | 12/2000 | Chen et al. |
| 6,169,691 B1 * | 1/2001 | Pasotti et al. ............ 365/185.25 |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 * | 10/2001 | So et al. ............ 365/185.03 |
| 6,804,805 B2 | 10/2001 | Rub |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 * | 5/2002 | Ishii et al. ............ 365/185.24 |
| 6,392,932 B1 * | 5/2002 | Ishii et al. ............ 365/185.24 |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 * | 9/2002 | Ishii et al. ............ 365/185.24 |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 * | 4/2003 | Tanaka et al. ............ 365/185.22 |
| 6,553,510 B1 * | 4/2003 | Pekny ............ 714/6.12 |
| 6,558,967 B1 | 5/2003 | Wong |
| 6,560,152 B1 | 5/2003 | Cernea |
| 6,567,311 B2 * | 5/2003 | Ishii et al. ............ 365/185.24 |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 * | 1/2004 | Ishii et al. ............ 365/185.24 |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |

| Patent No. | Kind | Date | Inventor | Class |
|---|---|---|---|---|
| 6,807,101 | B2 * | 10/2004 | Ooishi et al. | 365/185.21 |
| 6,809,964 | B2 | 10/2004 | Moschopoulos et al. | |
| 6,819,592 | B2 * | 11/2004 | Noguchi et al. | 365/185.17 |
| 6,829,167 | B2 | 12/2004 | Tu et al. | |
| 6,845,052 | B1 | 1/2005 | Ho et al. | |
| 6,851,018 | B2 | 2/2005 | Wyatt et al. | |
| 6,851,081 | B2 | 2/2005 | Yamamoto | |
| 6,856,546 | B2 | 2/2005 | Guterman et al. | |
| 6,862,218 | B2 | 3/2005 | Guterman et al. | |
| 6,870,767 | B2 | 3/2005 | Rudelic et al. | |
| 6,870,773 | B2 * | 3/2005 | Noguchi et al. | 365/185.22 |
| 6,873,552 | B2 * | 3/2005 | Ishii et al. | 365/185.24 |
| 6,879,520 | B2 * | 4/2005 | Hosono et al. | 365/185.17 |
| 6,882,567 | B1 * | 4/2005 | Wong | 365/185.03 |
| 6,894,926 | B2 | 5/2005 | Guterman et al. | |
| 6,907,497 | B2 | 6/2005 | Hosono et al. | |
| 6,925,009 | B2 * | 8/2005 | Noguchi et al. | 365/185.17 |
| 6,930,925 | B2 | 8/2005 | Guo et al. | |
| 6,934,188 | B2 | 8/2005 | Roohparvar | |
| 6,937,511 | B2 | 8/2005 | Hsu et al. | |
| 6,958,938 | B2 * | 10/2005 | Noguchi et al. | 365/185.22 |
| 6,963,505 | B2 | 11/2005 | Cohen | |
| 6,972,993 | B2 | 12/2005 | Conley et al. | |
| 6,988,175 | B2 | 1/2006 | Lasser | |
| 6,992,932 | B2 | 1/2006 | Cohen | |
| 6,999,344 | B2 * | 2/2006 | Hosono et al. | 365/185.17 |
| 7,002,843 | B2 | 2/2006 | Guterman et al. | |
| 7,006,379 | B2 * | 2/2006 | Noguchi et al. | 365/185.17 |
| 7,012,835 | B2 | 3/2006 | Gonzales et al. | |
| 7,020,017 | B2 | 3/2006 | Chen et al. | |
| 7,023,735 | B2 | 4/2006 | Ban et al. | |
| 7,031,210 | B2 | 4/2006 | Park et al. | |
| 7,031,214 | B2 | 4/2006 | Tran | |
| 7,031,216 | B2 | 4/2006 | You | |
| 7,039,846 | B2 | 5/2006 | Hewitt et al. | |
| 7,042,766 | B1 | 5/2006 | Wang et al. | |
| 7,054,193 | B1 | 5/2006 | Wong | |
| 7,054,199 | B2 | 5/2006 | Lee et al. | |
| 7,057,958 | B2 | 6/2006 | So et al. | |
| 7,065,147 | B2 | 6/2006 | Ophir et al. | |
| 7,068,539 | B2 | 6/2006 | Guterman et al. | |
| 7,071,849 | B2 | 7/2006 | Zhang | |
| 7,072,222 | B2 * | 7/2006 | Ishii et al. | 365/185.24 |
| 7,079,555 | B2 | 7/2006 | Baydar et al. | |
| 7,088,615 | B2 | 8/2006 | Guterman et al. | |
| 7,099,194 | B2 | 8/2006 | Tu et al. | |
| 7,102,924 | B2 | 9/2006 | Chen et al. | |
| 7,113,432 | B2 | 9/2006 | Mokhlesi | |
| 7,130,210 | B2 | 10/2006 | Bathul et al. | |
| 7,139,192 | B1 * | 11/2006 | Wong | 365/185.03 |
| 7,139,198 | B2 | 11/2006 | Guterman et al. | |
| 7,145,805 | B2 * | 12/2006 | Ishii et al. | 365/185.24 |
| 7,151,692 | B2 | 12/2006 | Wu | |
| 7,170,781 | B2 * | 1/2007 | So et al. | 365/185.03 |
| 7,170,802 | B2 | 1/2007 | Cernea et al. | |
| 7,173,859 | B2 | 2/2007 | Hemink | |
| 7,177,184 | B2 | 2/2007 | Chen | |
| 7,177,195 | B2 | 2/2007 | Gonzales et al. | |
| 7,177,199 | B2 | 2/2007 | Chen et al. | |
| 7,177,200 | B2 | 2/2007 | Ronen et al. | |
| 7,184,338 | B2 | 2/2007 | Nagakawa et al. | |
| 7,187,195 | B2 | 3/2007 | Kim | |
| 7,187,592 | B2 | 3/2007 | Guterman et al. | |
| 7,190,614 | B2 | 3/2007 | Wu | |
| 7,193,898 | B2 | 3/2007 | Cernea | |
| 7,193,921 | B2 | 3/2007 | Choi et al. | |
| 7,196,644 | B1 | 3/2007 | Anderson et al. | |
| 7,196,928 | B2 | 3/2007 | Chen | |
| 7,196,933 | B2 * | 3/2007 | Shibata | 365/185.22 |
| 7,197,594 | B2 | 3/2007 | Raz et al. | |
| 7,200,062 | B2 | 4/2007 | Kinsely et al. | |
| 7,210,077 | B2 | 4/2007 | Brandenberger et al. | |
| 7,221,592 | B2 | 5/2007 | Nazarian | |
| 7,224,613 | B2 | 5/2007 | Chen et al. | |
| 7,231,474 | B1 | 6/2007 | Helms et al. | |
| 7,231,562 | B2 | 6/2007 | Ohlhoff et al. | |
| 7,243,275 | B2 | 7/2007 | Gongwer et al. | |
| 7,254,690 | B2 | 8/2007 | Rao | |
| 7,254,763 | B2 | 8/2007 | Aadsen et al. | |
| 7,257,027 | B2 | 8/2007 | Park | |
| 7,259,987 | B2 | 8/2007 | Chen et al. | |
| 7,266,026 | B2 | 9/2007 | Gongwer et al. | |
| 7,266,069 | B2 | 9/2007 | Chu | |
| 7,269,066 | B2 * | 9/2007 | Nguyen et al. | 365/185.17 |
| 7,272,757 | B2 | 9/2007 | Stocken | |
| 7,274,611 | B2 | 9/2007 | Roohparvar | |
| 7,277,355 | B2 | 10/2007 | Tanzawa | |
| 7,280,398 | B1 | 10/2007 | Lee et al. | |
| 7,280,409 | B2 | 10/2007 | Misumi et al. | |
| 7,280,415 | B2 | 10/2007 | Hwang et al. | |
| 7,283,399 | B2 * | 10/2007 | Ishii et al. | 365/185.24 |
| 7,289,344 | B2 | 10/2007 | Chen | |
| 7,301,807 | B2 | 11/2007 | Khalid et al. | |
| 7,301,817 | B2 | 11/2007 | Li et al. | |
| 7,308,525 | B2 | 12/2007 | Lasser et al. | |
| 7,310,255 | B2 | 12/2007 | Chan | |
| 7,310,269 | B2 * | 12/2007 | Shibata | 365/185.17 |
| 7,310,271 | B2 * | 12/2007 | Lee | 365/185.22 |
| 7,310,272 | B1 * | 12/2007 | Mokhlesi et al. | 365/185.22 |
| 7,310,347 | B2 | 12/2007 | Lasser | |
| 7,321,509 | B2 | 1/2008 | Chen et al. | |
| 7,328,384 | B1 | 2/2008 | Kulkarni et al. | |
| 7,342,831 | B2 | 3/2008 | Mokhlesi et al. | |
| 7,343,330 | B1 | 3/2008 | Boesjes et al. | |
| 7,345,924 | B2 * | 3/2008 | Nguyen et al. | 365/185.28 |
| 7,345,928 | B2 | 3/2008 | Li | |
| 7,349,263 | B2 | 3/2008 | Kim et al. | |
| 7,356,755 | B2 | 4/2008 | Fackenthal | |
| 7,363,420 | B2 | 4/2008 | Lin et al. | |
| 7,365,671 | B1 | 4/2008 | Anderson | |
| 7,388,781 | B2 | 6/2008 | Litsyn et al. | |
| 7,397,697 | B2 * | 7/2008 | So et al. | 365/185.09 |
| 7,405,974 | B2 | 7/2008 | Yaoi et al. | |
| 7,405,979 | B2 * | 7/2008 | Ishii et al. | 365/185.29 |
| 7,408,804 | B2 | 8/2008 | Hemink et al. | |
| 7,408,810 | B2 | 8/2008 | Aritome et al. | |
| 7,409,473 | B2 | 8/2008 | Conley et al. | |
| 7,409,623 | B2 | 8/2008 | Baker et al. | |
| 7,420,847 | B2 | 9/2008 | Li | |
| 7,433,231 | B2 | 10/2008 | Aritome | |
| 7,433,697 | B2 | 10/2008 | Karaoguz et al. | |
| 7,434,111 | B2 | 10/2008 | Sugiura et al. | |
| 7,437,498 | B2 | 10/2008 | Ronen | |
| 7,440,324 | B2 | 10/2008 | Mokhlesi | |
| 7,440,331 | B2 * | 10/2008 | Hemink | 365/185.22 |
| 7,441,067 | B2 | 10/2008 | Gorobetz et al. | |
| 7,447,970 | B2 | 11/2008 | Wu et al. | |
| 7,450,421 | B2 * | 11/2008 | Mokhlesi et al. | 365/185.17 |
| 7,453,737 | B2 | 11/2008 | Ha | |
| 7,457,163 | B2 * | 11/2008 | Hemink | 365/185.22 |
| 7,457,897 | B1 | 11/2008 | Lee et al. | |
| 7,460,410 | B2 | 12/2008 | Nagai et al. | |
| 7,460,412 | B2 | 12/2008 | Lee et al. | |
| 7,466,592 | B2 | 12/2008 | Mitani et al. | |
| 7,468,907 | B2 | 12/2008 | Kang et al. | |
| 7,468,911 | B2 | 12/2008 | Lutze et al. | |
| 7,471,581 | B2 | 12/2008 | Tran et al. | |
| 7,483,319 | B2 | 1/2009 | Brown | |
| 7,487,329 | B2 | 2/2009 | Hepkin et al. | |
| 7,492,641 | B2 | 2/2009 | Hosono et al. | |
| 7,508,710 | B2 | 3/2009 | Mokhlesi | |
| 7,526,711 | B2 | 4/2009 | Orio | |
| 7,539,061 | B2 * | 5/2009 | Lee | 365/185.22 |
| 7,539,062 | B2 | 5/2009 | Doyle | |
| 7,551,492 | B2 | 6/2009 | Kim | |
| 7,558,109 | B2 | 7/2009 | Brandman et al. | |
| 7,558,839 | B1 | 7/2009 | McGovern | |
| 7,568,135 | B2 | 7/2009 | Cornwell et al. | |
| 7,570,520 | B2 | 8/2009 | Kamei et al. | |
| 7,590,002 | B2 * | 9/2009 | Mokhlesi et al. | 365/185.17 |
| 7,593,259 | B2 | 9/2009 | Kim et al. | |
| 7,594,093 | B1 | 9/2009 | Kancherla | |
| 7,596,707 | B1 | 9/2009 | Vemula | |
| 7,609,787 | B2 | 10/2009 | Jahan et al. | |
| 7,613,043 | B2 | 11/2009 | Cornwell et al. | |
| 7,616,498 | B2 * | 11/2009 | Mokhlesi et al. | 365/185.21 |
| 7,619,918 | B2 * | 11/2009 | Aritome | 365/185.03 |
| 7,631,245 | B2 | 12/2009 | Lasser | |

| | | |
|---|---|---|
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,810,017 B2 | 10/2010 | Radke |
| 7,848,149 B2 | 12/2010 | Gonzales et al. |
| 7,869,273 B2 * | 1/2011 | Lee et al. ............... 365/185.02 |
| 7,885,119 B2 | 2/2011 | Li |
| 7,928,497 B2 * | 4/2011 | Yaegashi ...................... 257/316 |
| 7,930,515 B2 | 4/2011 | Gupta et al. |
| 7,945,825 B2 * | 5/2011 | Cohen et al. ................. 714/721 |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobets |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 * | 8/2008 | Shalvi et al. ............. 365/185.02 |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |

| | | | |
|---|---|---|---|
| 2008/0263262 | A1 | 10/2008 | Sokolov et al. |
| 2008/0263676 | A1 | 10/2008 | Mo et al. |
| 2008/0270730 | A1 | 10/2008 | Lasser et al. |
| 2008/0282106 | A1 | 11/2008 | Shalvi et al. |
| 2008/0288714 | A1 | 11/2008 | Salomon et al. |
| 2009/0013233 | A1 | 1/2009 | Radke |
| 2009/0024905 | A1 | 1/2009 | Shalvi et al. |
| 2009/0034337 | A1 | 2/2009 | Aritome |
| 2009/0043831 | A1 | 2/2009 | Antonopoulos et al. |
| 2009/0043951 | A1 | 2/2009 | Shalvi et al. |
| 2009/0049234 | A1 | 2/2009 | Oh et al. |
| 2009/0073762 | A1 | 3/2009 | Lee et al. |
| 2009/0086542 | A1 | 4/2009 | Lee et al. |
| 2009/0089484 | A1 | 4/2009 | Chu |
| 2009/0091979 | A1 | 4/2009 | Shalvi |
| 2009/0094930 | A1 | 4/2009 | Schwoerer |
| 2009/0106485 | A1 | 4/2009 | Anholt |
| 2009/0112949 | A1 | 4/2009 | Ergan et al. |
| 2009/0132755 | A1 | 5/2009 | Radke |
| 2009/0144600 | A1 | 6/2009 | Perlmutter et al. |
| 2009/0150894 | A1 | 6/2009 | Huang et al. |
| 2009/0157950 | A1 | 6/2009 | Selinger |
| 2009/0157964 | A1 | 6/2009 | Kasorla et al. |
| 2009/0158126 | A1 | 6/2009 | Perlmutter et al. |
| 2009/0168524 | A1 | 7/2009 | Golov et al. |
| 2009/0172257 | A1 | 7/2009 | Prins et al. |
| 2009/0172261 | A1 | 7/2009 | Prins et al. |
| 2009/0193184 | A1 | 7/2009 | Yu et al. |
| 2009/0199074 | A1 | 8/2009 | Sommer et al. |
| 2009/0204824 | A1 | 8/2009 | Lin et al. |
| 2009/0204872 | A1 | 8/2009 | Yu et al. |
| 2009/0213653 | A1 | 8/2009 | Perlmutter et al. |
| 2009/0213654 | A1 | 8/2009 | Perlmutter et al. |
| 2009/0225595 | A1 | 9/2009 | Kim |
| 2009/0265509 | A1 | 10/2009 | Klein |
| 2009/0300227 | A1 | 12/2009 | Nochimowski et al. |
| 2009/0323412 | A1 | 12/2009 | Mokhlesi et al. |
| 2009/0327608 | A1 | 12/2009 | Eschmann |
| 2010/0017650 | A1 | 1/2010 | Chin et al. |
| 2010/0034022 | A1 | 2/2010 | Dutta et al. |
| 2010/0057976 | A1 | 3/2010 | Lasser |
| 2010/0061151 | A1 | 3/2010 | Miwa et al. |
| 2010/0082883 | A1 | 4/2010 | Chen et al. |
| 2010/0083247 | A1 | 4/2010 | Kanevsky et al. |
| 2010/0110580 | A1 | 5/2010 | Takashima |
| 2010/0131697 | A1 | 5/2010 | Alrod et al. |
| 2010/0142268 | A1 | 6/2010 | Aritome |
| 2010/0142277 | A1 | 6/2010 | Yang et al. |
| 2010/0169547 | A1 | 7/2010 | Ou |
| 2010/0169743 | A1 | 7/2010 | Vogan et al. |
| 2010/0174847 | A1 | 7/2010 | Paley et al. |
| 2011/0066793 | A1 | 3/2011 | Burd |
| 2011/0075482 | A1 | 3/2011 | Shepard et al. |
| 2011/0107049 | A1 | 5/2011 | Kwon et al. |
| 2011/0199823 | A1 | 8/2011 | Bar-Or et al. |
| 2011/0302354 | A1 | 12/2011 | Miller |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed Dec. 9, 2010.
U.S. Appl. No. 13/021,754 "Reducing Peak Current in Memory Systems" filed Feb. 6, 2011.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

U.S. Appl. No. 12/344,233 Official Action dated Jun. 24, 2011.

U.S. Appl. No. 11/995,813 Official Action dated Jun. 16, 2011.

Berman et al., "Mitigating Inter-Cell Coupling Effects in MLC NAND Flash via Constrained Coding", Flash Memory Summit, Santa Clara, USA, Aug. 19, 2010.

U.S. Appl. No. 12/178,318 Official Action dated May 31, 2011.

CN Patent Application # 200780026181.3 Official Action dated Apr. 8, 2011.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed Jun. 24, 2010.

US 7,161,836, 1/2007, Wan et al. (withdrawn).

U.S. Appl. No. 12/880,101 "Reuse of Host Hibernation Storage Space by Memory Controller", filed Sep. 12, 2010.

U.S. Appl. No. 12/890,724 "Error Correction Coding Over Multiple Memory Pages", filed Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE16: 16-Mbit, page-erasable serial flash memory with byte-alterability, 75 MHz SPI bus, standard pinout", Apr. 2008.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), p. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb Nrom Flash Data Storage Memory with 8 Mb/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{th}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
U.S. Appl. No. 12/649,360 Official Action dated Aug. 9, 2011.
U.S. Appl. No. 13/192,501, filed Jul. 28, 2011.
U.S. Appl. No. 13/192,495, filed Jul. 28, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed on Oct. 30, 2011.
U.S. Appl. No. 13/284,913, filed on Oct. 30, 2011.
U.S. Appl. No. 13/338,335, filed on Dec. 28, 2011.
U.S. Appl. No. 13/355,536, filed on Jan. 22, 2012.

* cited by examiner

REDUCTION OF BACK PATTERN DEPENDENCY EFFECTS IN MEMORY DEVICES

CROSS-REFERENCE TO RELATED APPLICATIONS

This application is a continuation in part of U.S. patent application Ser. No. 11/995,801, filed Jan. 15, 2008, which is a national phase application of PCT Application WO 2007/132453 claiming priority from U.S. Provisional Patent Application No. 60/886,429, filed Jan. 24, 2007, whose disclosures are all incorporated herein by reference. This application claims the benefit of U.S. Provisional Patent Application No. 60/891,569, filed Feb. 26, 2007 and U.S. Provisional Patent Application No. 60/938,192, filed May 16, 2007, whose disclosures are incorporated herein by reference.

FIELD OF THE INVENTION

The present invention relates generally to memory devices, and particularly to methods and systems for mitigating Back Pattern Dependency (BPD) effects in memory devices.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

In some memory device types, memory cells are arranged in cell strings. Each cell string comprises a group of cells that are connected back-to-back in series with one another. Cell strings are typically used, for example, in NAND Flash devices. NAND Flash devices are described, for example, by Jung et al., in "A 117 mm² 3.3 Volts Only 128-Mb Multilevel NAND Flash Memory for Mass Storage Applications," IEEE Journal of Solid State Circuits, (11:31), November, 1996, pages 1575-1583, and by Takeuchi et al., in "A Double Level $V_{TH}$ Select Gate Array Architecture for Multi-Level NAND Flash Memories," Digest of Technical Papers, 1995 Symposium on VLSI Circuits, Jun. 8-10, 1995, pages 69-70, which are incorporated herein by reference.

Memory cells that are arranged in cell strings sometimes suffer from Back Pattern Dependency (BPD) distortion. BPD distortion in a given cell is typically caused by changes in the conduction properties of other cells in the string, which cause an artificial shift in the storage value read from the given cell. U.S. Pat. No. 7,310,272, whose disclosure is incorporated herein by reference, describes a memory device that accounts for back pattern effects by applying a first voltage during a verify operation for unselected word lines that have been subjected to a programming operation, and a second voltage for unselected word lines that have not been subjected to a programming operation.

SUMMARY OF THE INVENTION

Embodiments of the present invention provide a method for operating a memory that includes multiple analog memory cells, the method including:

storing data in the memory by writing first storage values to the cells, so as to cause the cells to hold respective electrical charge levels;

after storing the data, reading second storage values from at least some of the cells, including at least one interfered cell that belongs to a group of cells;

detecting and canceling a Back Pattern Dependency (BPD) distortion caused by the electrical charge levels of one or more interfering cells in the group to at least one of the second storage values read from the at least one interfered cell; and processing the second storage values, including the at least one of the second storage values in which the BPD distortion was canceled, so as to reconstruct the data.

In some embodiments, the analog memory cells include NAND Flash cells, and the group of cells includes a NAND string. In an embodiment, detecting and canceling the BPD distortion include evaluating a condition indicating that the interfered cell is likely to be subject to the BPD distortion, and canceling the BPD distortion responsively to the evaluated condition. In another embodiment, storing the data includes encoding the data with an error detection code, and evaluating the condition includes decoding the error detection code and identifying a data error using the decoded error detection code. In yet another embodiment, reading the second storage values includes processing the read second storage values so as to identify one or more over-programmed cells among the memory cells in the memory, and evaluating the condition includes determining that the group of cells includes at least one of the over-programmed cells.

In a disclosed embodiment, detecting and canceling the BPD distortion include recursively estimating a part of the BPD distortion in a given cell in the group based on one or more other parts of the BPD distortion in respective one or more cells in the group that were programmed earlier than the given cell, and on the second storage values that were read from the one or more cells. Estimating the part of the BPD distortion may include measuring a total BPD distortion that is caused by the cells in the group, and estimating the part of the BPD distortion based on the total BPD distortion. In some embodiment, the cells in the group are connected in series to one another, and measuring the total BPD distortion includes applying pass voltages to respective gates of the cells in the group and measuring a current flowing through the cells responsively to the applied pass voltages.

In an embodiment, the cells in the group are connected in series to one another, reading the second storage value from the interfered cell includes applying a read voltage to a gate of the interfered cell, applying pass voltages to respective gates of the other cells in the group and measuring a current flowing through the cells responsively to the applied read voltage and pass voltages, and canceling the BPD distortion includes increasing at least one of the pass voltages and reading the second storage value from the interfered cell using the increased pass voltages. Increasing the pass voltages may include increasing the pass voltages of only a subset of the cells in the group that were programmed later than the interfered cell. Increasing the pass voltages may include increasing the pass voltages iteratively until meeting a condition indicating that the BPD distortion is canceled. In an embodiment, increasing the pass voltages includes storing the pass voltages for which the condition was met, and applying the stored pass voltages when performing a subsequent read operation on the group of cells.

In some embodiments, after reading the second storage value from the interfered cell using the increased pass voltages, the data stored in the group is copied to another group of the memory cells. In an embodiment, reading the second storage value from the interfered cell includes reading the second storage value multiple times while applying respective different values of the pass voltages to the gates of the other cells in the group, and canceling the BPD distortion includes selecting one of the read second storage values having a lowest level of the BPD distortion.

In a disclosed embodiment, the cells in the group are connected in series to one another, reading the second storage value from the interfered cell includes applying a read voltage to a gate of the interfered cell, applying pass voltages to respective gates of the other cells in the group and measuring a current flowing through the cells responsively to the applied read voltage and pass voltages, and canceling the BPD distortion includes reducing at least one of the pass voltages while not violating a predefined performance criterion, and reading the second storage value from the interfered cell using the reduced pass voltages.

In another embodiment, reading the second storage values includes processing the read second storage values so as to identify one or more over-programmed cells among the memory cells in the memory and storing information regarding the identified over-programmed cells, and canceling the BPD distortion includes processing the stored information regarding the over-programmed cells with regard to the read second storage values so as to cancel the BPD distortion. Processing the stored information may include estimating the BPD distortion based on the stored information and subtracting the estimated BPD distortion from the second storage value read from the interfered cell. In yet another embodiment, storing the data includes encoding the data with an Error Correction Code (ECC), processing the stored information includes calculating metrics for decoding the ECC based on the stored information, and processing the second storage values so as to reconstruct the data includes decoding the ECC responsively to the metrics.

In some embodiments, detecting the BPD distortion includes measuring shifts in one or more of the second storage values read from a subset of the cells in the group, which occurred after the cells were programmed, and estimating the BPD distortion responsively to the measured shifts. In an embodiment, storing the data includes encoding the data with an Error Correction Code (ECC), canceling the BPD distortion includes computing metrics for decoding the ECC based on the detected BPD distortion, and processing the second storage values so as to reconstruct the data includes decoding the ECC responsively to the metrics.

There is additionally provided, in accordance with an embodiment of the present invention, a data storage apparatus, including:

an interface, which is operative to communicate with a memory that includes multiple analog memory cells; and a processor, which is coupled to store data in the memory by writing first storage values to the cells so as to cause the cells to hold respective electrical charge levels, to read, after storing the data, second storage values from at least some of the cells, including at least one interfered cell that belongs to a group of cells, to detect and cancel a Back Pattern Dependency (BPD) distortion caused by the electrical charge levels of one or more interfering cells in the group to at least one of the second storage values read from the at least one interfered cell, and to process the second storage values, including the at least one of the second storage values in which the BPD distortion was canceled, so as to reconstruct the data.

There is further provided, in accordance with an embodiment of the present invention, a data storage apparatus, including:

a memory, which includes multiple analog memory cells; and a processor, which is coupled to store data in the memory by writing first storage values to the cells so as to cause the cells to hold respective electrical charge levels, to read, after storing the data, second storage values from at least some of the cells, including at least one interfered cell that belongs to a group of cells, to detect and cancel a Back Pattern Dependency (BPD) distortion caused by the electrical charge levels of one or more interfering cells in the group to at least one of the second storage values read from the at least one interfered cell, and to process the second storage values, including the at least one of the second storage values in which the BPD distortion was canceled, so as to reconstruct the data.

The present invention will be more fully understood from the following detailed description of the embodiments thereof, taken together with the drawings in which:

DETAILED DESCRIPTION OF EMBODIMENTS

Overview

Figure 1:
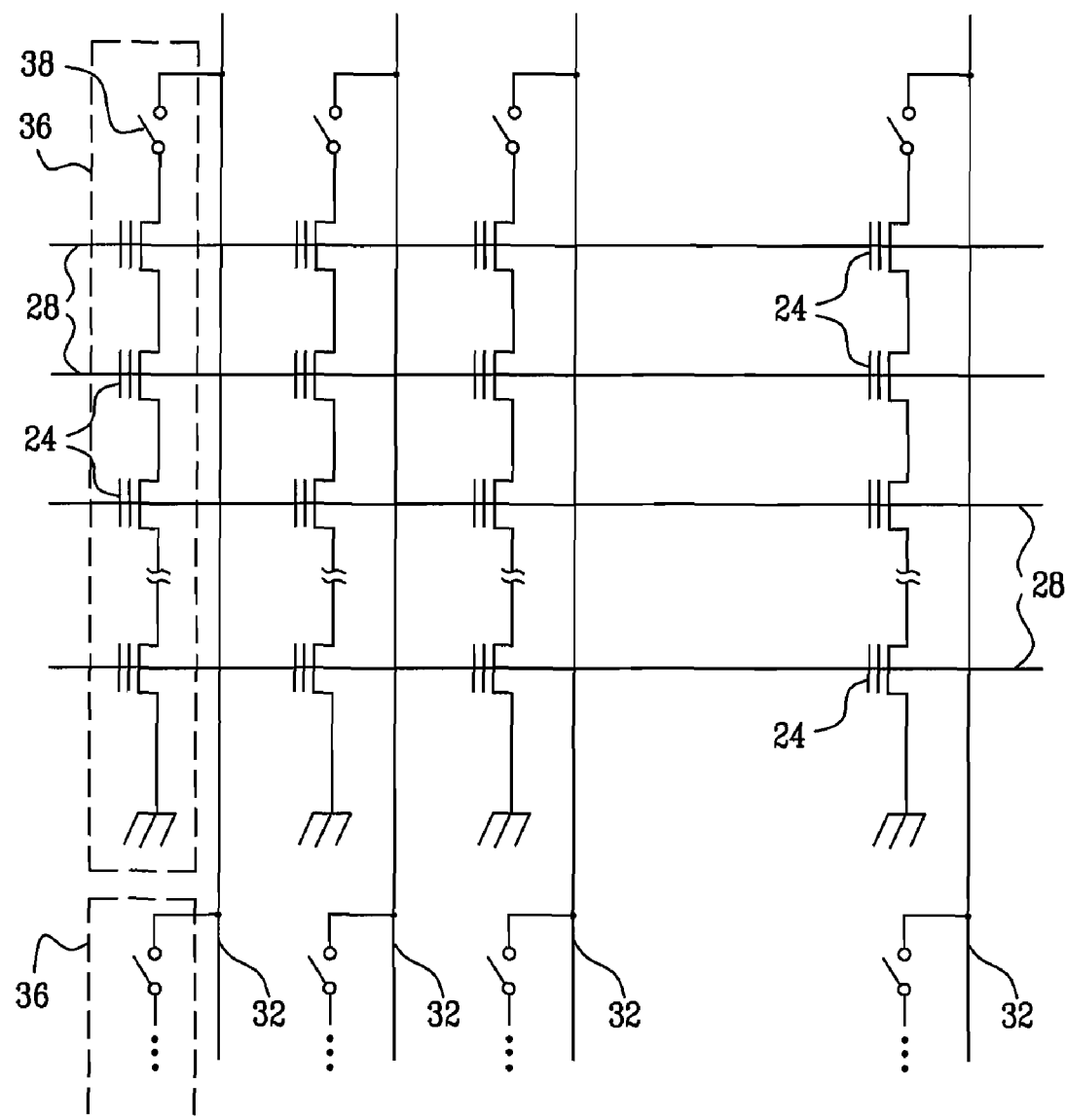
FIG. 1 is a block diagram that schematically illustrates a memory cell array, in accordance with an embodiment of the present invention.

Embodiments of the present invention provide methods and systems for canceling Back Pattern Dependency (BPD) distortion in arrays of analog memory cells. In the embodiments that are described hereinbelow, a Memory Signal Processor (MSP) stores data in a memory that includes multiple analog memory cells by writing respective storage values to the cells, thus causing the cells to hold respective electrical charge levels. In order to read the data, the MSP reads the storage values from at least some of the cells.

The memory may contain at least one interfered memory cell, whose storage value is distorted by BPD. An interfered cell of this sort belongs to a certain group of cells, and the storage value read from the cell is distorted by BPD that is caused by one or more electrical charge levels of other cells in the group. In some embodiments, the memory cells comprise NAND Flash cells, and the group of cells comprises a NAND string. The MSP cancels the BPD distortion in the storage value read from the interfered cell, and processes the read storage values to reconstruct the data.

Several methods for canceling BPD distortion are described in detail hereinbelow. Since in many memory devices BPD distortion is severe in only a relatively small number of cells, the MSP typically invokes these methods only when necessary. For example, the MSP may encode the stored data with an Error Correction Code (ECC), and apply BPD cancellation in response to a failure of the ECC decoding process.

In some cases, as will be explained below, the BPD distortion affecting a cell in a certain row (word line) of the array is caused primarily by cells in higher rows. In some embodiments, the MSP estimates the BPD distortion in a recursive calculation, which calculates the BPD level in each row based on the previously-calculated BPD of the lower rows and on the data read from these rows.

In some embodiments, when a cell that belongs to a given NAND string is read, certain pass voltages are applied to the other word lines associated with the string. In a disclosed method, the MSP increases the pass voltages in order to reduce the BPD level. The MSP typically increases the pass voltages only for NAND strings in which BPD is suspected, so as to minimize undesirable effects that are associated with high pass voltages.

In many cases, BPD is caused primarily by over-programmed memory cells. In another disclosed method, the MSP identifies over-programmed cells, stores information regarding the identified over-programmed cells, and uses the stored information to reduce BPD when reading the interfered cells. BPD may also be caused by shifts in the charge of the interfering cells, which occurred after the interfered cells were programmed. In yet another method, the MSP estimates the threshold voltage shifts and cancels the BPD based on the estimated shifts.

The BPD cancellation methods and systems described herein increase the capacity and the data storage reliability of analog memory cell arrays. The methods and systems described herein also enable reducing the pass voltages used in analog memory cell arrays, thus reducing power dissipation, the severity of program disturbs and/or memory cell wearing.

Memory Cell Array Configuration

FIG. 1 is a block diagram that schematically illustrates a memory cell array 20, in accordance with an embodiment of the present invention. Array 20 comprises a NAND Flash array, which comprises multiple analog memory cells 24. Each cell 24 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

Memory cells 24 of array 20 are arranged in a grid having multiple rows and columns. The gates of the transistors in each row are connected by word lines 28, and the transistors in each column are connected to bit lines 32. The transistors in a given column are arranged in groups, which are referred to as NAND strings 36. A given NAND string can be selected (i.e., connected to the bit line) by a string select switch 38. In a given string 28, the transistors are connected source-to-drain in series with one another. The first transistor in the string is connected to the bit line via switch 38. The last transistor is connected to ground or to another suitable baseline voltage. Each NAND string typically comprises thirty-two transistors, although any other suitable NAND string size can be used.

Array 20 is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Cells 24 are typically erased in blocks that contain multiple pages. Typically, erasure blocks comprise entire NAND strings, i.e., all cells of a given NAND string are typically erased en-bloc. Array 20 may comprise several thousand erasure blocks. In a typical two-bit-per-cell MLC device, each erasure block is on the order of thirty-two word lines, each comprising several thousand cells. Each word line of such a device is often partitioned into four pages (odd/even order cells, least/most significant bit of the cells). Three-bit-per cell devices having thirty-two word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

System Description

Figure 2:
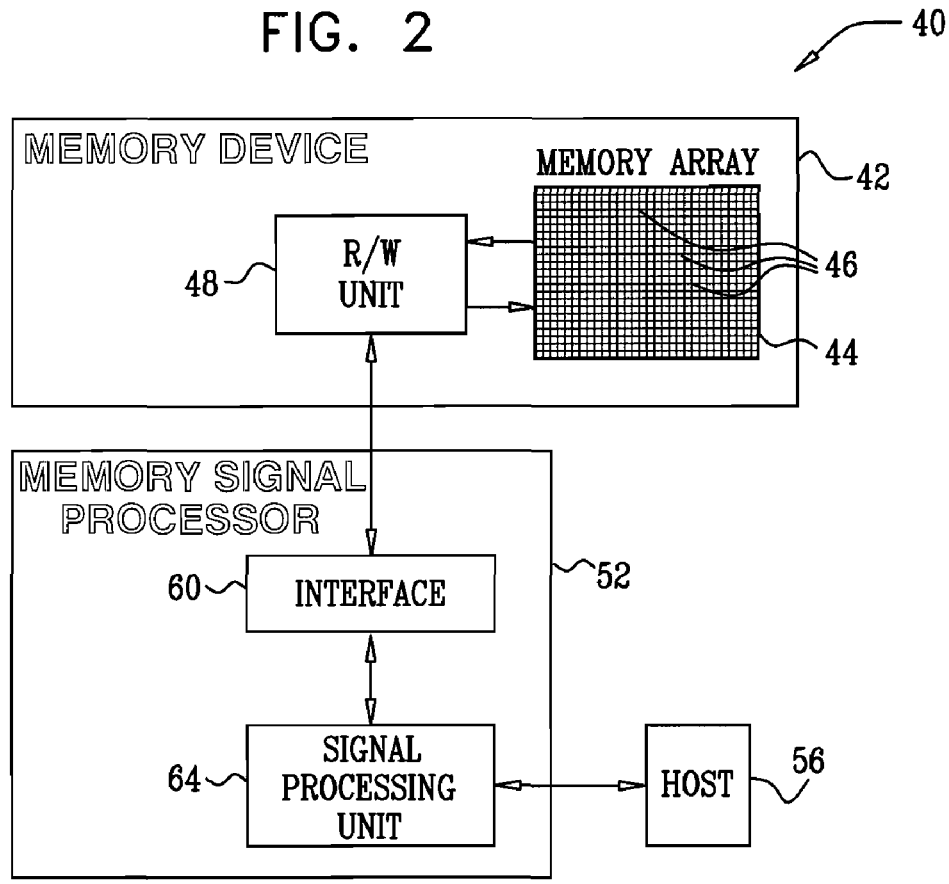
FIG. 2 is a block diagram that schematically illustrates a memory system, in accordance with an embodiment of the present invention.

FIG. 2 is a block diagram that schematically illustrates a memory system 40, in accordance with an embodiment of the present invention. System 40 can be used in various host systems and devices, such as in computing devices, cellular phones or other communication terminals, removable memory modules ("disk-on-key" devices), digital cameras, music and other media players and/or any other system or device in which data is stored and retrieved.

System 40 comprises a memory device 42, which stores data in a memory cell array 44. The memory array comprises multiple analog memory cells 46. In the context of the present patent application and in the claims, the term "analog memory cell" is used to describe any memory cell that holds a continuous, analog value of a physical parameter, such as an electrical voltage or charge. In the present example, array 44 comprises a NAND Flash array, whose memory cells are arranged in NAND strings, such as in the configuration of FIG. 1 above. Alternatively, array 44 may comprise other kinds of analog memory cells, such as, for example, NOR, AND or DINOR Flash cells.

The charge levels stored in the cells and/or the analog voltages or currents of the cells that result from programming the cells are referred to herein collectively as analog values or storage values. Although the embodiments described herein mainly address threshold voltages, the methods and systems described herein may be used with any other suitable kind of storage values. System 40 stores data in the analog memory cells by programming the cells to assume respective memory states, which are also referred to as programming levels. The memory states are selected from a finite set of possible states, and each state corresponds to a certain nominal storage value. For example, a 2 bit/cell MLC can be programmed to assume one of four possible memory states by writing one of four possible nominal storage values into the cell.

Memory device 42 comprises a reading/writing (R/W) unit 48, which converts data for storage in the memory device to analog storage values and writes them into memory cells 46. In alternative embodiments, the R/W unit does not perform the conversion, but is provided with voltage samples, i.e., with the storage values for storage in the cells. When reading data out of array 44, R/W unit 48 converts the storage values of memory cells 46 into digital samples having a resolution of one or more bits. In order to perform read and write operations, R/W unit 48 applies the appropriate voltages to the word lines and bit lines of array 44, and operates the string-select switches of the array.

The storage and retrieval of data in and out of memory device 28 is performed by a Memory Signal Processor (MSP) 52. MSP 52 communicates with a host 56, for accepting data for storage in the memory device and for outputting data retrieved from the memory device. MSP 52 comprises an interface 60 for communicating with memory device 42, and a signal processing unit 64, which processes the data that is written into and read from device 42. In some embodiments, unit 64 encodes the data for storage using an Error Correction Code (ECC), and decodes the ECC of the data retrieved from the memory.

In some embodiments, unit 64 produces the storage values for storing in the memory cells and provides these values to R/W unit 48. In alternative embodiments, unit 64 provides the data for storage, and the conversion to storage values is carried out by the R/W unit internally to the memory device. MSP 52, and in particular unit 64, may be implemented in hardware. Alternatively, MSP 52 may comprise a microprocessor that runs suitable software, or a combination of hardware and software elements.

The configuration of FIG. 2 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 2, memory device 42 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 52 can be implemented in software and carried out by a processor or other element of the host system. In some implementations, a single MSP 52 may be connected to multiple memory devices 42.

Back Pattern Dependency Effects

In order to read data from a particular memory cell, the R/W unit senses the cell's threshold voltage. The threshold voltage of a cell is commonly defined as the lowest voltage that should be applied to the cell's gate in order to cause the current between the cell's source and drain to exceed a certain value. The threshold voltage of a cell depends on the charge accumulated in its floating gate. When the desired cell is part of a NAND string, the threshold voltage of the desired cell (also referred to as the selected cell) is to be sensed, while minimizing the effects of other cells (unselected cells) in the same NAND string. In a typical read operation, the R/W unit applies suitable voltages to the word lines of the cells along the NAND string, and senses the current that flows in the bit line. (Although the description that follows refers to a single NAND string for the sake of clarity, the reading process is usually performed concurrently on multiple NAND strings.)

The R/W unit applies a certain read voltage, which depends on the read reference level, to the word line of the selected cell. The R/W unit applies another voltage, commonly referred to as a pass voltage denoted $V_{PASS}$, to the other word lines of the string. The pass voltage is typically a high voltage that is intended to cause the unselected cells to conduct, and to have source-drain voltage drops that are independent of their charge levels. In other words, the pass voltage is intended to cause the bit line current to reflect the charge level of the selected cell, and to be insensitive to the charge levels of the unselected cells.

In some embodiments, the R/W unit applies the appropriate word line voltages, pre-charges the bit line, and then connects the NAND string of the cell to the bit line using the appropriate string-select switch, thus causing the bit line to discharge via the NAND string. The R/W unit measures the bit line current or voltage after a certain period of time, and determines the threshold voltage of the selected cell based on the measurement. Alternatively, the R/W unit may use any other method for measuring the threshold voltage of the selected cell by sensing the bit line.

In practice, however, the bit line current is sometimes affected not only by the threshold voltage of the selected cell, but also by the charge levels of other cells in the NAND string. As a result, the bit line current sensed by the R/W unit may be distorted and may not truly reflect the charge level of the selected cell. The distortion caused to the sensed threshold voltage of the selected cell by charge levels of unselected cells in the NAND string is referred to as Back Pattern Dependency (BPD).

BPD may be produced, for example, when the conductivity of an unselected cell is not perfectly independent of its charge level, in spite of the pass voltage applied to its word line. In particular, when a certain cell is over-programmed, i.e., when its charge level is exceedingly high, the cell may not conduct properly even when a high pass voltage is applied to its word line. Thus, over-programmed cells are a major source of BPD.

Analog memory cells are often programmed using an iterative Program and Verify (P&V) process, as is known in the art. In a typical P&V process, an incrementally-increasing sequence of programming pulses is applied to the cells. The cell voltages are read between successive programming iterations and verified against the desired programming levels. When the cells are programmed using a P&V process, the iterative verification process may inherently compensate for some of the BPD distortion.

The P&V process may compensate for BPD caused by unselected cells whose charge levels did not change substantially between the time the selected cell is programmed and the time the selected cell is read. Thus, in some cases, residual BPD is caused primarily by unselected cells that were programmed later than the selected cell. In some memory devices, the cells are programmed in an ascending order of word lines. In these applications, BPD is caused primarily by cells in word lines that are higher than the word line of the selected cell. BPD may also be caused by cells whose charge levels have changed over time, for example because of aging, program disturbs or read disturbs.

BPD Estimation and Correction Methods

Embodiments of the present invention provide methods and systems for estimating and correcting BPD distortion effects. The methods described herein are carried out by MSP 52. In some embodiments, the MSP encodes the stored data with an ECC. Since BPD distortion is usually significant only in a relatively small number of cells in the array, the ECC decoding process of the MSP is often capable of correcting data errors that may be caused by BPD without explicitly detecting and correcting the actual BPD-related distortion. Thus, in some embodiments, the MSP invokes the methods described below only when necessary, e.g., in response to a failure of the ECC decoding process.

Figure 3:
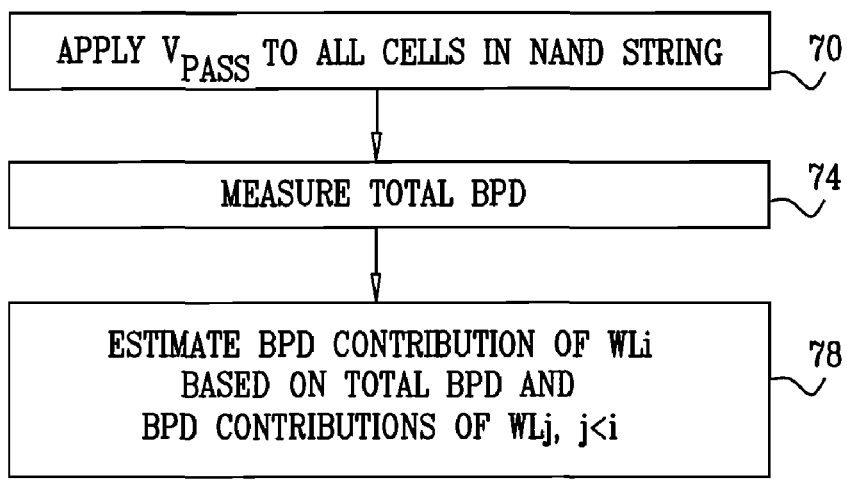
FIGS. 3-6 are flow charts that schematically illustrate methods for estimating and correcting Back Pattern Dependency (BPD) effects, in accordance with embodiments of the present invention.

FIG. 3 is a flow chart that schematically illustrates a method for estimating and correcting BPD effects, in accordance with an embodiment of the present invention. The method of FIG. 3 assumes, as explained above, that the BPD distortion that affects a selected cell belonging to a certain word line is caused by the cells in higher word lines. The BPD level is estimated in a recursive calculation, which calculates the BPD level in a certain word line based on the previously-calculated BPD of the lower word lines and on the programming levels of the string cells located in these word lines.

The method begins with the R/W unit applying a pass voltage $V_{PASS}$ to all the word lines of the NAND string in question, at a pass voltage application step 70. When $V_{PASS}$ is applied to all the word lines, the MSP measures the total amount of BPD caused by the cells in the NAND string, at a total BPD measurement step 74. The MSP senses the bit line current or voltage under these conditions, and estimates the total BPD level.

The MSP may measure the total BPD level, for example, by pre-charging the bit line that is connected to the string, and measuring the time required for the bit line to discharge through the cells of the string when $V_{PASS}$ is applied to the gates of all the string's cells.

The measured total BPD value, denoted $BPD_{TOTAL}$, is used as an estimate of the BPD that affects the lowest word line in the string, denoted $WL_0$. (After performing step 70, the MSP can decide which strings suffer from severe BPD and are to undergo BPD cancellation and which strings have tolerable BPD levels.)

The MSP now estimates the BPD contributed by the other word lines, at a BPD estimation step 78. The BPD level distortion in the NAND string cell that belongs to word line $WL_i$ can be estimated based on the BPD contributions of the cells in the lower word lines and on the data (programming level) read from the lower word lines by $$BPD_{WLi} = BPD_{TOTAL} - \sum_{j=0}^{i-1} f(LEVEL_{WLj})$$

wherein $BPD_{WLi}$ denotes the BPD distortion caused to the NAND string cell in word line i, $LEVEL_{WLj}$ denotes the programming level of the NAND string cell of word line j, and f(x) denotes a function that estimates the expected BPD caused by a cell whose programming level is x. Generally, $LEVEL_{WLj}$ may refer to the analog storage value read from the cell at word line j, or to the programming state (programming level) to which this value corresponds.

Thus, the MSP first reads the programming level of the cell in word line $WL_0$, estimates the BPD distortion in the cell of word line $WL_1$ (denoted $BPD_{WL_1}$) based on the total BPD and on the level read from word line $WL_0$, and so on.

Although the example above refers to a scenario in which the memory is programmed in ascending order of word lines, the method of FIG. 3 can be used in other scenarios, as well. Generally, the MSP can carry out the recursive process of FIG. 3 and estimate the BPD contribution of a given cell based on the BPD contributions of the cells that were programmed before the given cell, and on the data read from these cells.

Alternatively, the BPD distortion in the cell of word line i can be estimated by reading the levels of the cells in word lines i+1, i+2, . . . N, wherein N denotes the index of the last word line in the string, and calculating $$BPD_{WLi} = \sum_{j=i+1}^{N} f(LEVEL_{WLj})$$

The estimated BPD distortion levels can be subtracted from the storage values read from the cells. Alternatively, the estimated distortion levels can be taken into account when calculating likelihood metrics of the data stored the cells. Such metrics may subsequently be used for soft decoding of an Error Correction Code (ECC) that encodes the data.

Figure 4:
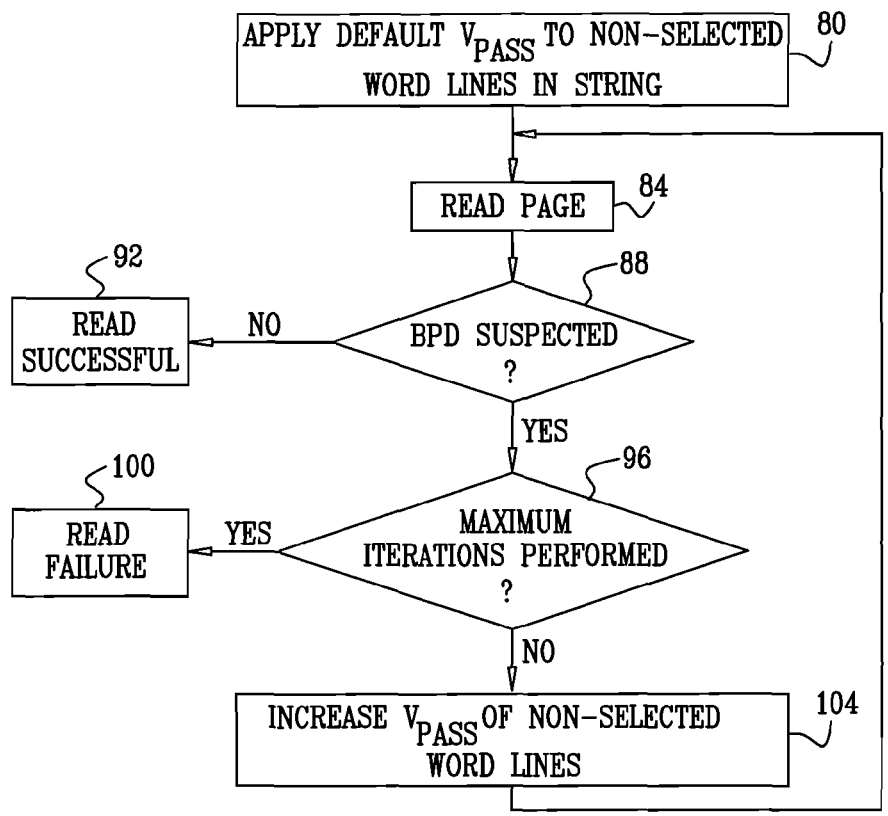

FIG. 4 is a flow chart that schematically illustrates another method for identifying and correcting BPD effects, in accordance with an alternative embodiment of the present invention. The method of FIG. 4 identifies memory pages that are suspected of suffering from BPD, and in response increases the pass voltages applied to at least some of the unselected word lines in the NAND strings of these pages.

The method begins with system 40 intending to read a certain target memory page, which is stored in a group of memory cells along a certain word line in the memory cell array. The word line belongs to a certain set of NAND strings. The R/W unit applies a default value of the pass voltage $V_{PASS}$ to the unselected word lines of the NAND strings, at a default $V_{PASS}$ application step 80. The MSP then reads the memory page, at a reading step 84.

The MSP checks whether the read page is suspected of suffering from BPD, at a BPD checking step 88. The MSP can evaluate any suitable condition that indicates whether a page is likely to suffer from BPD. For example, the MSP may regard any page whose ECC decoding fails as a suspect. Alternatively, the MSP may encode the data with an error detection code, such as a Cyclic Redundancy Check (CRC), and regard read pages whose CRC fails as suspects. In the present context, an ECC is also considered to be a type of error detection code.

Additionally or alternatively, the MSP may maintain information regarding locations of over-programmed cells in the memory array. The MSP may regard a page as a suspect if the unselected word lines belonging to the same NAND strings as the page contain over-programmed cells. In some embodiments, the MSP may consider only over-programmed cells that were programmed later than the page in question (e.g., cells that are located in word lines that are higher than the word line of the read page). Several exemplary techniques for collecting and storing information regarding over-programmed cells are described further below.

If the read operation is successful or if the read page is not suspected of suffering from BPD, the MSP regards the page as successfully-read, at a read success step 92. Otherwise, the MSP initiates an iterative process that gradually increases the pass voltages of some or all of the unselected cells, attempting to reduce the BPD level.

The MSP checks whether a maximum allowed number of iterations has been performed, at an iteration number checking step 96. If the maximum number of iterations has already been performed and the page is still suspected of suffering from BPD, the MSP declares a read failure, at a read failure step 100.

Otherwise, the MSP instructs the R/W unit to increase the pass voltages applied to unselected word lines, at a $V_{PASS}$ increasing step 104. The R/W unit increases the pass voltages, such as by a predetermined step size. For example, the default pass voltage may be set at 6V, and the pass voltage may be increased by 0.5V in each iteration. Alternatively, any other suitable default value and step size can be used. The step size may be fixed or variable. After increasing the pass voltages, the method loops back to reading step 84 above. The MSP re-reads the page with the increased pass voltages, attempting to reduce the BPD level.

In some embodiments, the maximum number of iterations allowed in step 96 is two. In these embodiments, the pass voltage is increased only once and the page is re-read only once.

In some embodiments, the MSP increases only the pass voltages applied to the word lines that were programmed later than the read page, assuming that BPD may only be caused by cells in those word lines. Word lines that were programmed before the page in question are read with the default pass voltage. Alternatively, the MSP may increase the pass voltages of all unselected word lines, or of any desired subset of the unselected word lines. For example, when information regarding the locations of over-programmed cells is available, the MSP may increase only the pass voltages of word lines that contain over-programmed cells.

Increasing pass voltages may sometimes have undesirable effects. For example, higher pass voltages may increase the power dissipation of the memory device, cause higher read disturbs and/or increase the wearing of cells. Since the method of FIG. 4 increases the pass voltages selectively, only for word lines that are suspected of causing BPD, these undesired effects can be reduced. Since BPD effects are relatively rare, only a small fraction of the total number of word lines in the device will typically have their pass voltages increased using the method of FIG. 4.

In some embodiments, the R/W unit and the MSP carry out the method of FIG. 4 by performing multiple read operations on a given page, each read operation performed with a different pass voltage value. In these embodiments, the MSP selects the result of the read operation that is most likely to have the lowest BPD. This technique is useful, for example, in memory device configurations that do not enable applying different pass voltages simultaneously to different word lines. The MSP may select the result based on any suitable criteria, such as on the data values read from the desired page or from cells in the unselected word lines.

In some embodiments, when a certain $V_{PASS}$ value is known to perform well in a given group of cells (e.g., an erasure block), the MSP stores this $V_{PASS}$ value for future use. For example, when the method of FIG. 4 terminates successfully at step 92, the MSP stores the $V_{PASS}$ value that was used in the last iteration. The value may be stored in one or more of the memory cells of the group, or in any other suitable location. If the MSP reads data again from this group of cells at a later time, the stored value can be used as the default value.

In some embodiments, after reading the page using the increased pass voltages, the MSP copies the data to another page and resets the pass voltages to their default values. Using this technique, the data can be accessed again at a later time if necessary, without the need to use high pass voltages. Alternatively, the MSP may copy the data of the entire erasure block to another block, or re-program the data in the same cells (typically after erasing the block).

The technique of modifying the pass voltages responsively to the BPD level can also be used for reducing the pass voltages, and thus reducing power dissipation, program disturbs and wearing of cells. For example, the MSP may gradually reduce the pass voltages applied to the unselected word lines, as long as the reading performance remains acceptable, i.e., as long as a certain performance-related criterion is not violated. For example, the MSP may reduce $V_{PASS}$ until read errors begin to appear or until the Bit Error Rate (BER) of the read data reaches a certain threshold. Using this method, each group of cells (e.g., each erasure block) can be read using the minimal pass voltage that still ensures tolerable performance.

Figure 5:
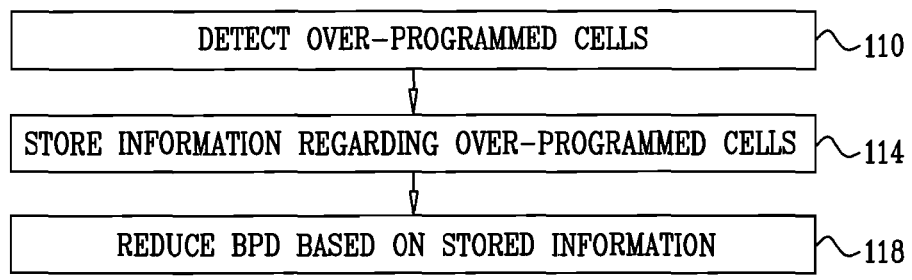

FIG. 5 is a flow chart that schematically illustrates yet another method for estimating and correcting BPD effects, in accordance with an embodiment of the present invention. As explained above, over-programmed memory cells are a major source of BPD distortion. The method of FIG. 5 detects the presence of over-programmed cells and reduces the BPD effects they produce.

The method begins with the MSP identifying over-programmed memory cells by reading the threshold voltages of cells in array 44, at an over-programmed cell identification step 110. Detection of over-programmed cells may be performed at any time during the memory device's lifetime. For example, the MSP may detect over-programmed cells immediately after programming, such as by using the last verification iteration of the P&V process that programs the cells. Additionally or alternatively, the MSP may detect over-programmed cells during read operations. Further additionally or alternatively, the MSP may run a background task that identifies over-programmed cells during idle periods of system 40. Identification of over-programmed cells can be performed periodically for all cells, after each memory access operation, in response to a certain event (e.g., failure of an ECC or other error detection code) or using any other suitable logic.

The MSP stores over-programming information regarding the identified over-programmed cells, at an over-programming information storage step 114. The MSP may collect and store any suitable information regarding the over-programmed cells identified at step 110, such as the locations of the over-programmed cells, quantitative measures indicative of the amount or severity of over-programming, information pertaining to groups of cells (e.g., the number of over-programmed cells in a given NAND string or erasure block) and/or any other suitable information.

The information can be stored in any suitable location, such as in some of the memory cells of array 44 or in a different memory. In some embodiments, the MSP compresses the information regarding over-programmed cells before storage, in order to reduce the amount of memory needed for storing the information.

When reading data from the memory cells in the array, the MSP processes the stored over-programming information so as to reduce the BPD-related distortion in the read cells, at a BPD reduction step 118. For example, when reading a set of potentially-interfered cells, the MSP may estimate the BPD distortion caused to the potentially-interfered cells by the over-programmed cells, and subtract the distortion from the threshold voltages read from the potentially-interfered cells.

In some embodiments, the ECC decoding process used by the MSP operates on quality metrics associated with the values read from the cells. In these embodiments, the MSP may calculate the quality metrics of the potentially-interfered cells based on the over-programming information. For example, the ECC decoding process may accept erasures, which indicate values of poor quality. The MSP may identify that some of the potentially-interfered cells have poor reliability because of BPD, and mark the values read from these cells as "erasures" to the ECC decoding process.

As yet another example, the ECC decoding process may operate on soft quality metrics, such as on Log Likelihood Ratios (LLRs). The MSP can estimate statistical characteristics of the BPD distortion, and calculate the soft quality metrics of data values of the potentially-interfered cells based on the BPD statistics. Additionally or alternatively, the MSP may use any other suitable method for reducing the BPD distortion in the potentially-interfered cells using the stored information regarding over-programmed cells. Some aspects of using quality metrics for decoding ECC in memory arrays are described in PCT Application WO 2007/132457, entitled "Combined Distortion Estimation and Error Correction Coding for Memory Devices, filed May 10, 2007, whose disclosure is incorporated herein by reference.

In some embodiments, the MSP may search for potentially-interfering cells (which may or may not be over-programmed), read the threshold voltages of the potentially-interfering cells and use the read threshold voltages for reducing or canceling the BPD distortion in potentially-interfered cells. For example, as explained in the description of FIG. 3 above, when ECC decoding of a page in word line $WL_n$ fails, the MSP may read the potentially-interfering cells in word lines $WL_{n+1}, WL_{n+2}, \ldots, WL_N$, wherein N denotes the number of word lines in the block. The MSP can then estimate the BPD error caused to each potentially-interfered cell in $WL_n$ based on the values read from the potentially-interfering cells, subtract the estimated BPD error from the values read from the potentially-interfered cells of $WL_n$, and re-apply ECC decoding.

The BPD reduction techniques used for implementing step 118 can also be used in conjunction with other BPD identification methods, such as when BPD is estimated using the methods of FIG. 3 above.

Figure 6:
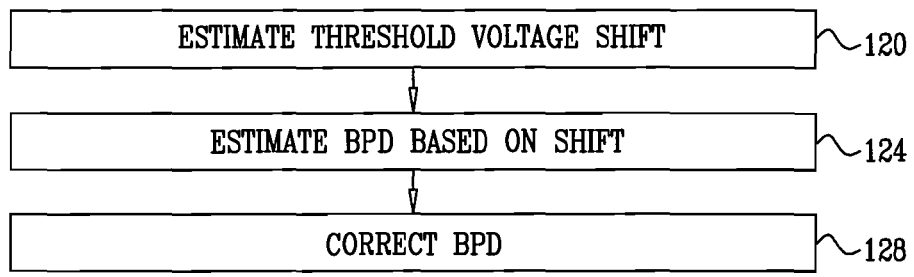

FIG. 6 is a flow chart that schematically illustrates another method for estimating and correcting BPD effects, in accordance with another embodiment of the present invention. In this method, the MSP measures shifts in the threshold voltages of memory cells, and estimates the BPD effect that may be caused by these shifts on potentially-interfered cells.

The method begins with the MSP estimating the threshold voltage shifts in the memory cells of a given NAND string, at a shift estimation step 120. (Although the method description refers to a certain NAND string, the method is typically carried out during normal read operations performed on the memory, and is performed for multiple NAND strings in parallel.)

The MSP estimates the threshold voltage shifts that occurred since the cells were programmed, e.g., due to aging. For example, the MSP may apply ECC decoding so as to detect the programming level of each cell, and compare the threshold voltage read from the cell to the nominal threshold value associated with the cell's programming level. Alternatively, the MSP can estimate the threshold voltage shifts using any other suitable technique.

The MSP then estimates the BPD distortion that may be caused by the threshold voltage shifts to potentially-interfered cells, at a BPD estimation step 124. Typically, the MSP assumes that the threshold voltage shifts of a cell in word line $WL_n$ may cause BPD primarily in the cells that are located in word lines $WL_{n+1}, W_{n+2}, \ldots$ of the same NAND string. The MSP then corrects the estimated BPD distortion in the potentially-interfered cells, at a BPD correction step 128. The MSP may correct the BPD distortion using any of the techniques described above, such as by directly subtracting the BPD errors from the values read from the potentially-interfered cells, or by calculating quality metrics of the potentially-interfered cells based on the estimated BPD error.

Since the methods described herein reduce BPD distortion effects, the MSP may reduce the pass voltages ($V_{PASS}$) that are applied to the unselected word lines of the NAND string when using any of these methods. Thus, the methods described herein enable reducing the memory device power dissipation, program disturbs and/or cell wearing. Alternatively, the BPD cancellation methods described herein can enable increasing the voltage levels of the cells, allowing a higher voltage window, more reliable operation and/or a higher number of programming levels (i.e., more information bits per cell).

Although the embodiments described herein mainly address reducing BPD error in NAND strings, the methods and systems described herein can also be used for reducing distortion in any other suitable group of memory cells. Although the embodiments described herein mainly address writing and reading data in solid-state memory devices, the principles of the present invention can also be used for programming and reading other types of storage devices, such as Hard Disk Drives (HDD).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory that includes multiple analog memory cells, the method comprising:

storing data in the memory by writing first storage values to the cells, so as to cause the cells to hold respective electrical charge levels;

after storing the data, reading second storage values from at least some of the cells, including at least one interfered cell that belongs to a group of cells;

detecting and canceling a Back Pattern Dependency (BPD) distortion caused by the electrical charge levels of one or more interfering cells in the group to at least one of the second storage values read from the at least one interfered cell; and processing the second storage values, including the at least one of the second storage values in which the BPD distortion was canceled, so as to reconstruct the data, wherein detecting and canceling the BPD distortion comprise recursively estimating a part of the BPD distortion in a given cell in the group based on one or more other parts of the BPD distortion in respective one or more cells in the group that were programmed earlier than the given cell, and on the second storage values that were read from the one or more cells, and wherein estimating the part of the BPD distortion comprises measuring a total BPD distortion that is caused by the cells in the group, and estimating the part of the BPD distortion based on the total BPD distortion.

2. The method according to claim 1, wherein the analog memory cells comprise NAND Flash cells, and wherein the group of cells comprises a NAND string.

3. The method according to claim 1, wherein detecting and canceling the BPD distortion comprise evaluating a condition indicating that the interfered cell is likely to be subject to the BPD distortion, and canceling the BPD distortion responsively to the evaluated condition.

4. The method according to claim 3, wherein storing the data comprises encoding the data with an error detection code, and wherein evaluating the condition comprises decoding the error detection code and identifying a data error using the decoded error detection code.

5. The method according to claim 3, wherein reading the second storage values comprises processing the read second storage values so as to identify one or more over-programmed cells among the memory cells in the memory, and wherein evaluating the condition comprises determining that the group of cells comprises at least one of the over-programmed cells.

6. The method according to claim 1, wherein the cells in the group are connected in series to one another, and wherein measuring the total BPD distortion comprises applying pass voltages to respective gates of the cells in the group and measuring a current flowing through the cells responsively to the applied pass voltages.

7. The method according to claim 1, wherein the cells in the group are connected in series to one another, wherein reading the second storage value from the interfered cell comprises applying a read voltage to a gate of the interfered cell, applying pass voltages to respective gates of the other cells in the group and measuring a current flowing through the cells responsively to the applied read voltage and pass voltages, and wherein canceling the BPD distortion comprises increasing at least one of the pass voltages and reading the second storage value from the interfered cell using the increased pass voltages.

8. The method according to claim 7, wherein increasing the pass voltages comprises increasing the pass voltages of only a subset of the cells in the group that were programmed later than the interfered cell.

9. The method according to claim 7, wherein increasing the pass voltages comprises increasing the pass voltages iteratively until meeting a condition indicating that the BPD distortion is canceled.

10. The method according to claim 9, wherein increasing the pass voltages comprises storing the pass voltages for which the condition was met, and applying the stored pass voltages when performing a subsequent read operation on the group of cells.

11. The method according to claim 7, and comprising, after reading the second storage value from the interfered cell using the increased pass voltages, copying the data stored in the group to another group of the memory cells.

12. The method according to claim 7, wherein reading the second storage value from the interfered cell comprises reading the second storage value multiple times while applying respective different values of the pass voltages to the gates of the other cells in the group, and wherein canceling the BPD distortion comprises selecting one of the read second storage values having a lowest level of the BPD distortion.

13. The method according to claim 1, wherein detecting the BPD distortion comprises measuring shifts in one or more of the second storage values read from a subset of the cells in the group, which occurred after the cells were programmed, and estimating the BPD distortion responsively to the measured shifts.

14. The method according to claim 1, wherein storing the data comprises encoding the data with an Error Correction Code (ECC), wherein canceling the BPD distortion comprises computing metrics for decoding the ECC based on the detected BPD distortion, and wherein processing the second storage values so as to reconstruct the data comprises decoding the ECC responsively to the metrics.

15. The method according to claim 1, wherein reading the second storage values comprises processing the read second storage values so as to identify one or more over-programmed cells among the memory cells in the memory and storing information regarding the identified over-programmed cells, and wherein canceling the BPD distortion comprises processing the stored information regarding the over-programmed cells with regard to the read second storage values so as to cancel the BPD distortion.

16. The method according to claim 15, wherein processing the stored information comprises estimating the BPD distortion based on the stored information and subtracting the estimated BPD distortion from the second storage value read from the interfered cell.

17. The method according to claim 15, wherein storing the data comprises encoding the data with an Error Correction Code (ECC), wherein processing the stored information comprises calculating metrics for decoding the ECC based on the stored information, and wherein processing the second storage values so as to reconstruct the data comprises decoding the ECC responsively to the metrics.

18. A method for operating a memory that includes multiple analog memory cells, the method comprising:
    storing data in the memory by writing first storage values to the cells, so as to cause the cells to hold respective electrical charge levels;
    after storing the data, reading second storage values from at least some of the cells, including at least one interfered cell that belongs to a group of cells;
    detecting and canceling a Back Pattern Dependency (BPD) distortion caused by the electrical charge levels of one or more interfering cells in the group to at least one of the second storage values read from the at least one interfered cell; and
    processing the second storage values, including the at least one of the second storage values in which the BPD distortion was canceled, so as to reconstruct the data,
    wherein the cells in the group are connected in series to one another, wherein reading the second storage value from the interfered cell comprises applying a read voltage to a gate of the interfered cell, applying pass voltages to respective gates of the other cells in the group and measuring a current flowing through the cells responsively to the applied read voltage and pass voltages, and wherein canceling the BPD distortion comprises reducing at least one of the pass voltages while not violating a predefined performance criterion, and reading the second storage value from the interfered cell using the reduced pass voltages.

19. A data storage apparatus, comprising:
    an interface, which is operative to communicate with a memory that includes multiple analog memory cells; and
    a processor, which is coupled to store data in the memory by writing first storage values to the cells so as to cause the cells to hold respective electrical charge levels, to read, after storing the data, second storage values from at least some of the cells, including at least one interfered cell that belongs to a group of cells, to detect and cancel a Back Pattern Dependency (BPD) distortion caused by the electrical charge levels of one or more interfering cells in the group to at least one of the second storage values read from the at least one interfered cell, and to process the second storage values, including the at least one of the second storage values in which the BPD distortion was canceled, so as to reconstruct the data, wherein the processor is coupled to recursively estimate a part of the BPD distortion in a given cell in the group based on one or more other parts of the BPD distortion in one or more cells in the group that were programmed earlier than the given cell, and on the second storage values that were read from the one or more cells, and to estimate the part of the BPD distortion by measuring a total BPD distortion that is caused by the cells in the group, and estimating the part of the BPD distortion based on the total BPD distortion.

20. The apparatus according to claim 19, wherein the analog memory cells comprise NAND Flash cells, and wherein the group of cells comprises a NAND string.

21. The apparatus according to claim 19, wherein the processor is coupled to evaluate a condition indicating that the interfered cell is likely to be subject to the BPD distortion, and to cancel the BPD distortion responsively to the evaluated condition.

22. The apparatus according to claim 21, wherein the processor is coupled to encode the data with an error detection code and to decode the error detection code when reconstructing the data, and wherein the condition checks whether a data error is identified by the decoded error detection code.

23. The apparatus according to claim 21, wherein the processor is coupled to process the read second storage values so as to identify one or more over-programmed cells among the memory cells in the memory, and wherein the condition checks whether the group of cells comprises at least one of the over-programmed cells.

24. The apparatus according to claim 19, wherein the cells in the group are connected in series to one another, and wherein the processor is coupled to measure the total BPD distortion by applying pass voltages to respective gates of the cells in the group and measuring a current flowing through the cells responsively to the applied pass voltages.

25. The apparatus according to claim 19, wherein the cells in the group are connected in series to one another, wherein the processor is coupled to read the second storage value from the interfered cell by applying a read voltage to a gate of the interfered cell, applying pass voltages to respective gates of the other cells in the group and measuring a current flowing through the cells responsively to the applied read voltage and pass voltages, and to cancel the BPD distortion by increasing at least one of the pass voltages and reading the second storage value from the interfered cell using the increased pass voltages.

26. The apparatus according to claim 25, wherein the processor is coupled to increase the pass voltages of only a subset of the cells in the group that were programmed later than the interfered cell.

27. The apparatus according to claim 25, wherein the processor is coupled to increase the pass voltages iteratively until meeting a condition indicating that the BPD distortion is canceled.

28. The apparatus according to claim 27, wherein the processor is coupled to store the pass voltages for which the condition was met, and to apply the stored pass voltages when performing a subsequent read operation on the group of cells.

29. The apparatus according to claim 25, wherein the processor is coupled to copy the data stored in the group to another group of the memory cells after reading the second storage value from the interfered cell using the increased pass voltages.

30. The apparatus according to claim 25, wherein the processor is coupled to read the second storage value from the interfered cell multiple times while applying respective different values of the pass voltages to the gates of the other cells in the group, and to select one of the read second storage values having a lowest level of the BPD distortion.

31. The apparatus according to claim 19, wherein the processor is coupled to process the read second storage values so as to identify one or more over-programmed cells among the memory cells in the memory, to store information regarding the identified over-programmed cells, and to process the stored information regarding the over-programmed cells with regard to the read second storage values so as to cancel the BPD distortion.

32. The apparatus according to claim 31, wherein the processor is coupled to estimate the BPD distortion based on the stored information and to subtract the estimated BPD distortion from the second storage value read from the interfered cell.

33. The apparatus according to claim 31, wherein the processor is coupled to encode the data with an Error Correction Code (ECC), to calculate metrics for decoding the ECC based on the stored information, and to decode the ECC responsively to the metrics.

34. The apparatus according to claim 19, wherein the processor is coupled to measure shifts in one or more of the second storage values read from a subset of the cells in the group, which occurred after the cells were programmed, and to estimate the BPD distortion responsively to the measured shifts.

35. The apparatus according to claim 19, wherein the processor is coupled to encode the data with an Error Correction Code (ECC), to compute metrics for decoding the ECC based on the detected BPD distortion, and to decode the ECC responsively to the metrics so as to reconstruct the data.

36. A data storage apparatus, comprising:
an interface, which is operative to communicate with a memory that includes multiple analog memory cells; and
a processor, which is coupled to store data in the memory by writing first storage values to the cells so as to cause the cells to hold respective electrical charge levels, to read, after storing the data, second storage values from at least some of the cells, including at least one interfered cell that belongs to a group of cells, to detect and cancel a Back Pattern Dependency (BPD) distortion caused by the electrical charge levels of one or more interfering cells in the group to at least one of the second storage values read from the at least one interfered cell, and to process the second storage values, including the at least one of the second storage values in which the BPD distortion was canceled, so as to reconstruct the data,
wherein the cells in the group are connected in series to one another, wherein the processor is coupled to read the second storage value from the interfered cell by applying a read voltage to a gate of the interfered cell, applying pass voltages to respective gates of the other cells in the group and measuring a current flowing through the cells responsively to the applied read voltage and pass voltages, and to cancel the BPD distortion by reducing at least one of the pass voltages while not violating a predefined performance criterion, and reading the second storage value from the interfered cell using the reduced pass voltages.

37. A data storage apparatus, comprising:

a memory, which comprises multiple analog memory cells; and a processor, which is coupled to store data in the memory by writing first storage values to the cells so as to cause the cells to hold respective electrical charge levels, to read, after storing the data, second storage values from at least some of the cells, including at least one interfered cell that belongs to a group of cells, to detect and cancel a Back Pattern Dependency (BPD) distortion caused by the electrical charge levels of one or more interfering cells in the group to at least one of the second storage values read from the at least one interfered cell, and to process the second storage values, including the at least one of the second storage values in which the BPD distortion was canceled, so as to reconstruct the data, wherein the processor is coupled to recursively estimate a part of the BPD distortion in a given cell in the group based on one or more other parts of the BPD distortion in one or more cells in the group that were programmed earlier than the given cell, and on the second storage values that were read from the one or more cells, and to estimate the part of the BPD distortion by measuring a total BPD distortion that is caused by the cells in the group, and estimating the part of the BPD distortion based on the total BPD distortion.

* * * * *